(12) United States Patent
Asai et al.

(10) Patent No.: US 7,084,484 B2
(45) Date of Patent: Aug. 1, 2006

(54) SEMICONDUCTOR INTEGRATED CIRCUIT

(75) Inventors: Akira Asai, Osaka (JP); Takeshi Takagi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/910,573

(22) Filed: Aug. 4, 2004

(65) Prior Publication Data

US 2005/0006709 A1    Jan. 13, 2005

(51) Int. Cl.
*H01L 27/082* (2006.01)

(52) U.S. Cl. .................. 257/565; 257/197; 257/198; 257/566; 257/592

(58) Field of Classification Search ................ 257/194, 257/197, 198, 565, 566, 592
See application file for complete search history.

(56) References Cited

U.S. PATENT DOCUMENTS

| 5,691,546 A * | 11/1997 | Morishita ..................... 257/19 |
| 5,864,169 A * | 1/1999 | Shimura et al. ............ 257/587 |
| 6,475,849 B1 * | 11/2002 | Racanelli ..................... 438/202 |
| 6,759,697 B1 * | 7/2004 | Toyoda et al. .............. 257/197 |
| 6,781,214 B1 * | 8/2004 | U'Ren et al. ................ 257/591 |
| 2002/0020851 A1 | 2/2002 | Sakuma |
| 2002/0038874 A1 | 4/2002 | Egashira |
| 2002/0139996 A1 | 10/2002 | Jagannathan |

FOREIGN PATENT DOCUMENTS

| EP | 1 065 728 A2 | 1/2001 |
| EP | 1 187 218 A2 | 3/2002 |
| JP | 47-41781 | 10/1972 |
| JP | 58-108765 | 6/1983 |
| JP | 1-231371 | 9/1989 |
| JP | 5-243253 | 9/1993 |
| JP | 8-274027 | 10/1996 |
| JP | 2001-68479 | 3/2001 |
| JP | 2001-68480 | 3/2001 |
| JP | 2001-168105 | 6/2001 |
| JP | 2001-223222 | 8/2001 |
| JP | 2002-64105 | 2/2002 |
| JP | 2002-110690 | 4/2002 |
| JP | 2002-158232 | 5/2002 |
| JP | 2002-270817 | 9/2002 |
| JP | 2002-270819 | 9/2002 |
| JP | 2002-324805 | 11/2002 |
| WO | WO 02-075814 A1 | 9/2002 |

* cited by examiner

*Primary Examiner*—Nathan J. Flynn
*Assistant Examiner*—Tan Tran
(74) *Attorney, Agent, or Firm*—McDermott Will & Emery LLP

(57) ABSTRACT

A semiconductor integrated circuit including a plurality of bipolar transistors that are produced by forming, in a plurality of transistor-producing regions, a first conductive type emitter layer on the front surface side of a second conductive type base layer that is formed on the surface side of a first conductive collector layer and contains germanium, the first conductive type emitter layer being formed from a semiconductor material having a band gap larger than the base layer. The concentrations of impurities contained in the emitter layers vary among the plurality of transistor-producing regions, and the germanium concentrations differ in the base-emitter junction interfaces of at least two of the transistor-producing regions, such that the ON-state voltages required for turning the plurality of bipolar transistors into an ON state differ from each other. This semiconductor integrated circuit makes it possible to reduce power consumption while maintaining the excellent performance of a bipolar transistor.

15 Claims, 9 Drawing Sheets

(a)

(b)

(c)

(a)

(b)

(c)

(a)

(b)

US 7,084,484 B2

SEMICONDUCTOR INTEGRATED CIRCUIT

TECHNICAL FIELD

The present invention relates to a fabrication method for a semiconductor integrated circuit having a plurality of bipolar transistors and to such a semiconductor integrated circuit.

BACKGROUND ART

In recent years, for example, a few of SiGe-HBTs (heterobipolar transistors) including an SiGe base layer, are being used in high-frequency analog circuits, such as cellular telephones and wireless LANs. SiGe-Bi CMOS processing technology, etc., is used for the fabrication thereof. Japanese Unexamined Patent Publication Nos. 2001-68480, 2001-168105, and 2001-223222 disclose bipolar transistors, wherein improved operating speeds and lower power consumption are the main objects to be achieved. For example, Japanese Unexamined Patent Publication No. 2001-223222 proposes increasing the doping concentration of the emitter layer to reduce power loss by lowering the voltage drop between the emitter and collector when the transistor is turned on.

To reduce power consumption, in a semiconductor integrated circuit using a plurality of bipolar transistors, it is desirable that the ON-state voltage (the base voltage required to turn the transistor into an ON state) be independently set for each bipolar transistor depending on the circuit characteristics, etc. For example, power consumption can be reduced by setting the ON-state voltage low in a transistor on the output side of a semiconductor integrated circuit so that current may easily flow, and setting the ON-state voltage high in a transistor on the input side so that current cannot flow easily. However, it was difficult to separately set the ON-state voltage at desired levels without degrading the characteristics of each transistor.

DISCLOSURE OF THE INVENTION

The present invention aims to provide a method for fabricating a semiconductor integrated circuit and a semiconductor integrated circuit in which power can be saved while maintaining the excellent performance of a bipolar transistor.

An object of the present invention can be achieved by a method for fabricating a semiconductor integrated circuit provided with a plurality of bipolar transistors having at least two different ON-state voltages required to turn the bipolar transistors into an ON state comprising:

an emitter layer formation step of forming an emitter layer on the front surface side of a base layer that is formed on the front surface side of a collector layer containing first conductive impurities and that contains second conductive impurities including germanium, the emitter layer being formed from a semiconductor material that has a band gap larger than that of the base layer and containing the first conductive impurities in a plurality of transistor-producing regions;

a lithography step in which the emitter layer is covered with a resist film in part of the transistor-producing regions;

an impurity doping step of introducing the first conductive impurities into the exposed emitter layer in the remaining part of the transistor-producing regions; and a heat treatment step in which the first conductive impurities contained in the emitter layer are diffused into the base layer by heat treating at least the emitter layer.

Another object of the present invention can be achieved by a semiconductor integrated circuit comprising a plurality of bipolar transistors that are obtained by forming, in a plurality of transistor-producing regions, a first conductive type emitter layer on the front surface side of a second conductive type base layer that is formed on the front surface side of a first-conductive collector layer and that contains germanium, the first conductive type emitter layer being formed from a semiconductor material having a band gap larger than the base layer;

the concentrations of impurities contained in the emitter layer varying among the plurality of transistor-producing regions, causing the germanium concentrations to be different in base-emitter junction interfaces of at least two of the transistor-producing regions, thus making ON-state voltages, which are necessary for turning the plurality of the bipolar transistors into an ON state different from each other.

BEST MODE FOR CARRYING OUT THE INVENTION

Hereinafter, embodiments of the present invention will be explained with reference to the accompanying drawings.

(Principle of the Present Invention)

Figure 1:
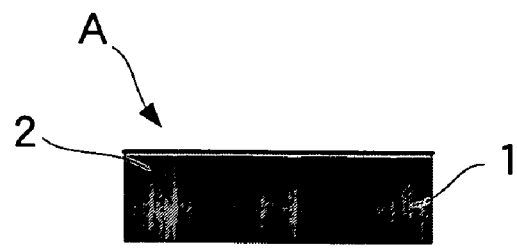
FIGS. 1(a)–(c) show cross-sectional views of fabrication steps for a semiconductor device to explain the principle of the present invention.
Figure 1:
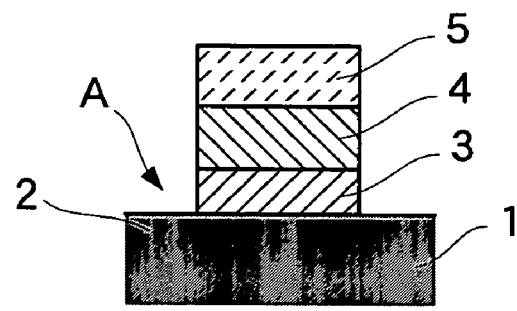
Figure 1:
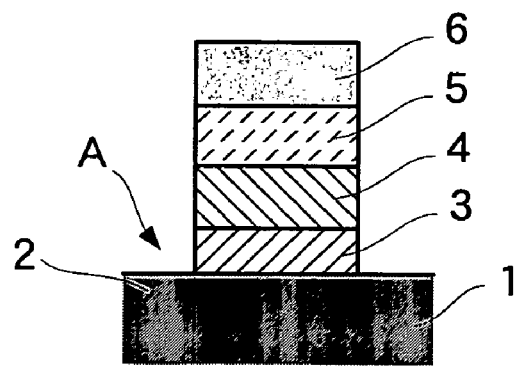

FIG. 1 is a cross-sectional view of the steps of fabricating a semiconductor device. This figure is intended to illustrate the principle of the present invention.

First, as shown in FIG. 1(a), after forming an isolation area (not shown) on a silicon substrate 1 by lithography, an n-type collector layer 2 is formed in a transistor-producing region A by ion implantation. In the present embodiment, the collector layer 2 is formed after forming the isolation area; however, it is also possible to form the isolation area after forming the collector layer 2.

Second, as shown in FIG. 1(b), a buffer layer 3 consisting of SiGe, a base layer 4 consisting of SiGe, and a cap layer 5 consisting of Si are formed in this order on the surface of the collector layer 2 by using an epitaxial technique. Specifically, a mixture of Si-based gas (for example, $Si_2H_6$ or $SiH_4$) and Ge-based gas (for example, $GeH_4$) is used as a process gas, the ratio of the Ge-based gas relative to the Si-based gas being maintained at a constant level while forming the buffer layer 3, for which SiGe is epitaxially grown. During the formation of the base layer 4, the ratio of the Ge-based gas relative to the Si-based gas is gradually decreased and SiGe is epitaxially grown so that the concentration of Ge eventually becomes 0%. Only Si-based gas is supplied while forming the cap layer 5, for which Si is epitaxially grown. Consequently, the concentration of Ge in the base layer 4 linearly decreases from the buffer layer 3 (collector layer 2 side) towards the cap layer 5 (emitter layer 6 side) (see FIG. 2). The maximum value of the Ge concentration in the base layer 4 is approximately 15%, and the thickness of the buffer layer 3, the base layer 4, and the cap layer 5 may be, for example, 20 nm, 30 nm, and 20 nm, respectively.

The base layer 4 is formed using $B_2H_6$ and the like reaction gases, for in-situ doping of boron having a concentration of approximately from $1\times10^{18}$ to $1\times10^{20}$ cm$^{-3}$.

Next, as shown in FIG. 1(c), the emitter layer 6 consists of polysilicon is formed on the surface of the cap layer 5 by CVD. At this time, phosphorus is doped to the emitter layer 6 by ion implantation or in-situ doping. Subsequently, the dopant is diffused and activated by performing heat treatment for a short time, i.e., approximately 1 to 30 seconds at approximately 800–1050° C. Thereafter, a portion of the emitter layer 6 is removed by etching, etc., to expose the cap layer 5, and an emitter electrode, a base electrode, and a collector electrode (not shown) are then formed, completing the formation of the bipolar transistor.

Figure 2:
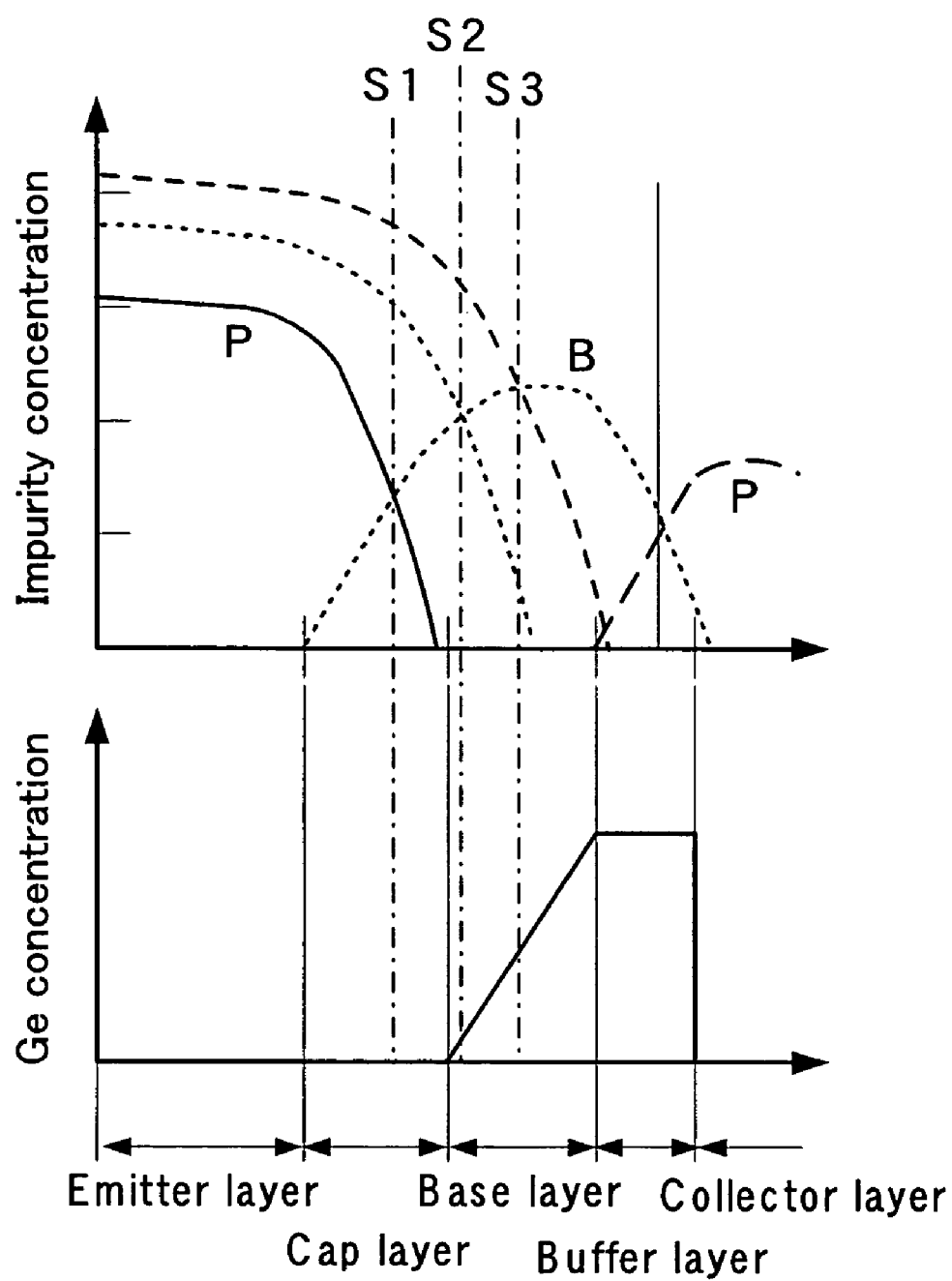
FIG. 2 shows the distributions of the impurity concentration and Ge concentration in a transistor-producing region.

The higher the concentration of the phosphorus in the emitter layer 6, the more deeply the phosphorus is diffused. Therefore, the position of the junction interface (the location of the plane where the phosphorus concentration in the emitter layer 6 and the boron concentration introduced into the base layer 4 become the same) between the base and the emitter (base-emitter) becomes deeper when the phosphorus concentration in the emitter layer 6 becomes higher. In other words, as shown in FIG. 2, when the phosphorus concentration is low, the junction interface S1 between the base and emitter is located in the cap layer 5 in which Ge does not exist, and when the phosphorus concentration is medium or high, the junction interfaces S2 and S3 between the base and emitter are located in the base layer 4, which contains Ge. As a result, when the junction interface is S1, the emitter region is composed of the emitter layer 6 and a part of the cap layer 5, and when the junction interfaces are S2 and S3, the emitter region is composed of a part of the base layer 4 in addition to the emitter layer 6 and the cap layer 5.

As described above, because the concentration of Ge in the base layer 4 increases as it becomes deeper, as viewed from the emitter layer 6, compared to the junction interface S2, whose phosphorus concentration is medium, Ge concentration in the junction interface S3, whose phosphorus concentration is high, is higher. Examples of the phosphorus concentration in the emitter layer 6 are such that low concentration is approximately $2\times10^{18}$ cm$^{-3}$, medium concentration is approximately $5\times10^{18}$ cm$^{-3}$ and high concentration is approximately $2\times10^{19}$ cm$^{-3}$.

Figure 3:
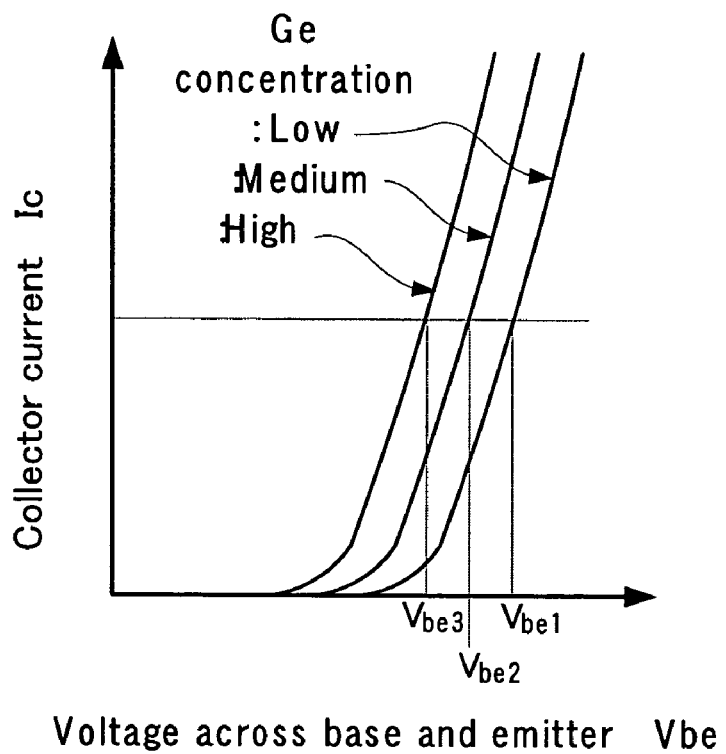
FIG. 3 shows the relationship between the Ge concentration and the I-V curve in the junction interface between a base and an emitter.

As described above, the concentration of Ge in the base-emitter junction interface after heat treatment varies depending on the concentration of phosphorus contained in the emitter layer 6. The relationship between the Ge concentration in the base-emitter junction interface and the I-V curve of a transistor was investigated, and the results shown in FIG. 3 were obtained. When the Ge concentration in the junction interface is low (corresponding to the junction interface S1 of FIG. 2), the ON-state voltage is Vbe1. When the Ge concentration in the junction interface is medium (corresponding to the junction interface S2 of FIG. 2), the ON-state voltage is Vbe2. When the Ge concentration in the junction interface is high (corresponding to the junction interface S3 of FIG. 2), the ON-state voltage is Vbe3. The relationship is therefore Vbe1>Vbe2>Vbe3. Here, the ON-state voltage is the voltage required to turn on the transistor. In the present embodiment, the ON-state voltage is the voltage across the base and the emitter that causes the collector current $I^c$ to reach or exceed a predetermined value.

Figure 4:
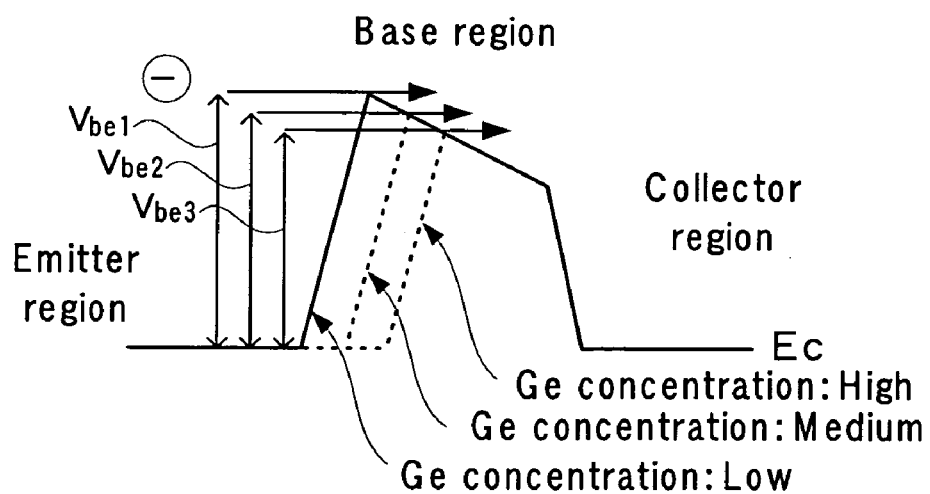
FIG. 4 is a schematic diagram showing an energy band.

This phenomenon is explained below using a drawing of the energy band. As shown in FIG. 4, the bottom end of the conduction band $E_c$ forms the peak from an emitter region towards the base region, and this peak becomes an energy barrier for electrons traveling from the emitter to the collector. The height of the energy barrier varies depending on the energy band gap in the base-emitter junction interface. When the band gap is narrower, the height of the energy barrier becomes lower. SiGe has a smaller band gap than Si, and the higher the Ge concentration, the smaller the band gap. Therefore, when the Ge concentration in the junction interface becomes higher, the energy required to overcome the energy barrier becomes lower, making the ON-state voltage low.

The present invention is accomplished based on the above findings. In other words, the present invention teaches that, by using the fact that the depth of the base-emitter junction interface can be controlled by introducing Ge into the base layer 4, varying the concentration of phosphorus introduced into the emitter layer 6, and subsequently performing heat treatment under predetermined conditions, it is possible to set the ON-state voltage at a predetermined value in each transistor of a semiconductor integrated circuit having a plurality of transistors on the same substrate. This makes it possible to maintain excellent performance by the transistors and to set the ON-state voltage at the level that is most suitable for the circuit characteristics, etc., thus making it possible to reduce the power consumption.

(Fabrication Method for a Semiconductor Integrated Circuit)

Figure 5:
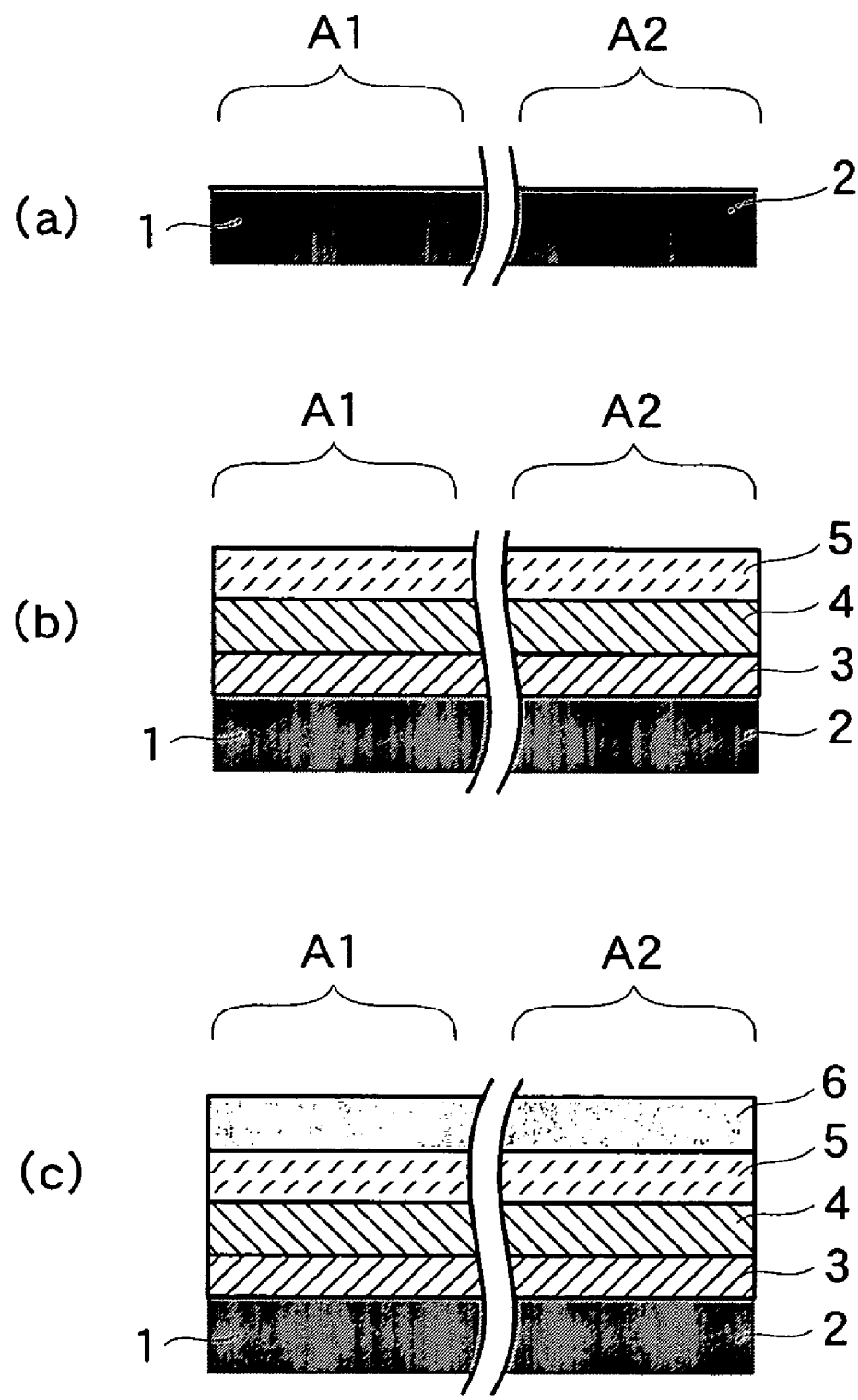
FIGS. 5(a)–(c) are cross-sectional views illustrating steps of forming an emitter layer in a fabrication method for a semiconductor integrated circuit according to one embodiment of the present invention.
Figure 6:
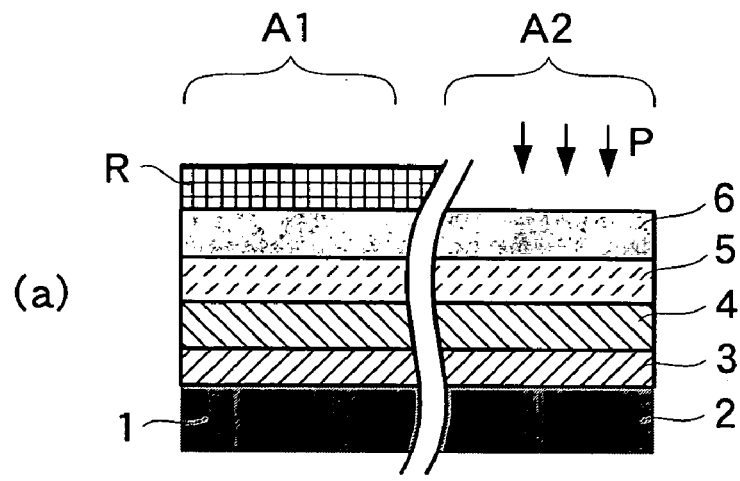
FIGS. 6(a)–(c) are cross-sectional views illustrating (a) a lithography step, (b) an ion-implantation step, and (c) an etching step in a method for fabricating a semiconductor integrated circuit according to one embodiment of the present invention.
Figure 6:
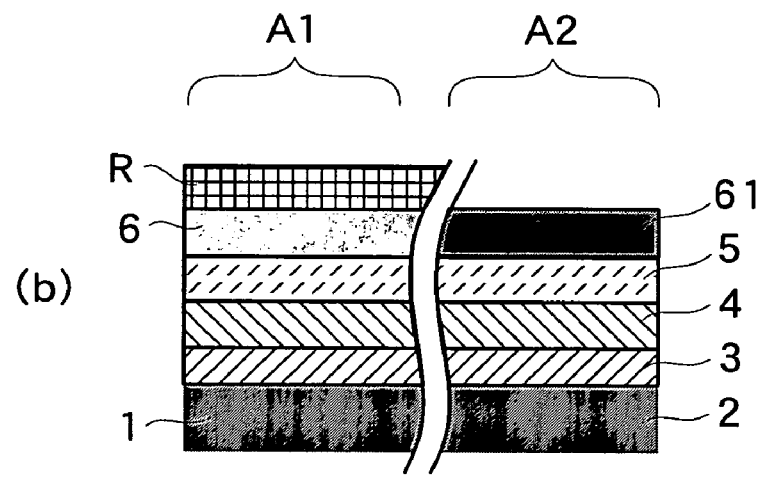
Figure 6:
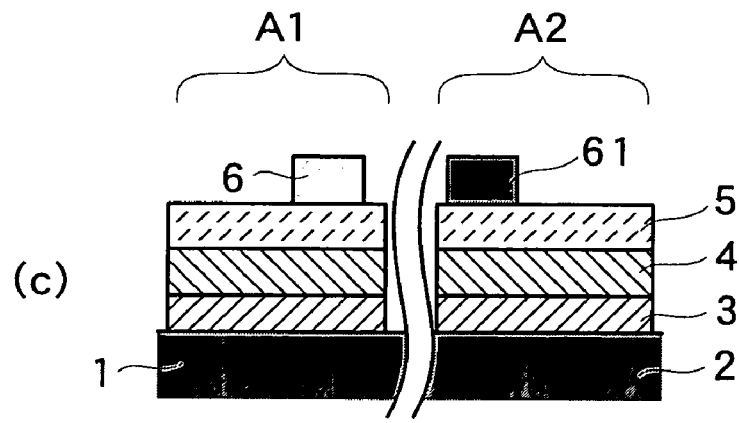
Figure 7:
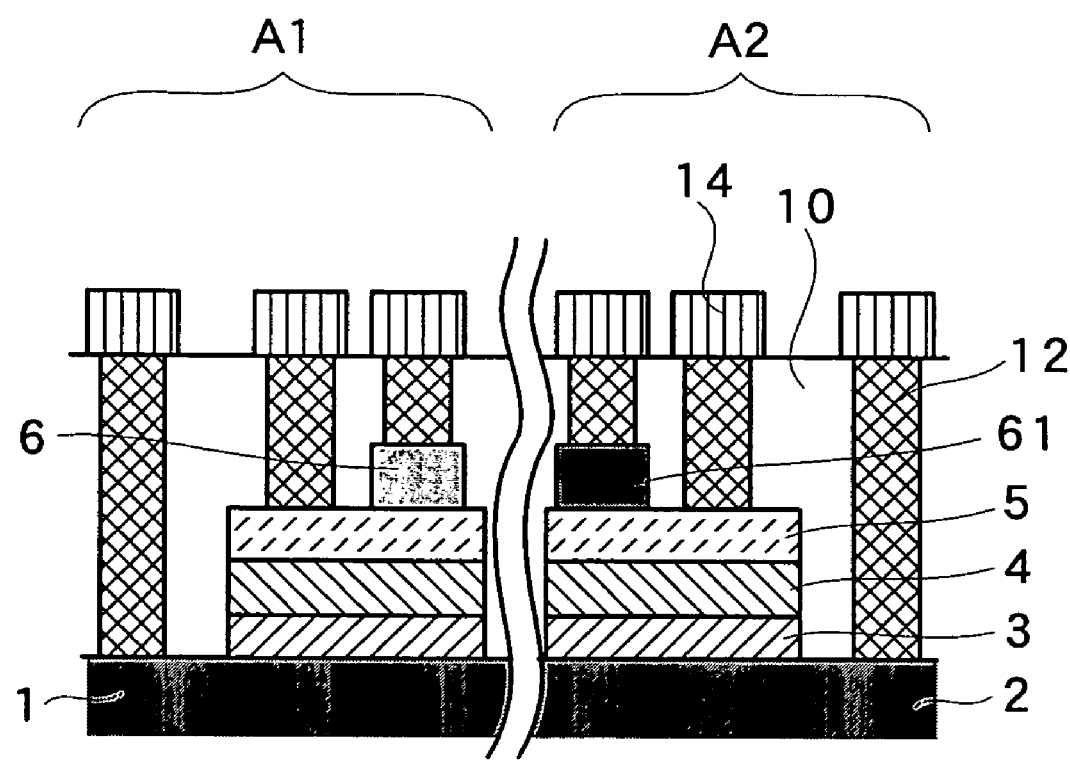
FIG. 7 is a cross-sectional view of a semiconductor integrated circuit according to one embodiment of the present invention.

FIGS. 5 to 7 are cross-sectional views illustrating the steps of fabricating a semiconductor integrated circuit according to one embodiment of the present invention.

First, an emitter formation step is conducted as described below. As shown in FIG. 5(a), after forming an isolation area (not shown) on a silicon substrate 1 by lithography, an n-type collector layer 2 is formed by ion implantation into first and second transistor-producing regions A1 and A2. In the present embodiment, the collector layer 2 is formed after forming the isolation area; however, it is also possible to form the isolation area after forming the collector layer 2.

Second, as shown in FIG. 5(b), a buffer layer 3 consisting of SiGe, a base layer 4 consisting of SiGe, and a cap layer 5 consisting of Si are formed in this order on the surface of the collector layer 2 by using an epitaxial crystal growth technique. The specific method is the same as that described above, wherein the concentration of Ge in the base layer 4 is set so as to linearly decrease towards the cap layer 5 (emitter side) from the buffer layer 3 (collector side). It is possible to form the buffer layer 3, the base layer 4, and the cap layer 5 both in the first and second transistor-producing regions A1 and A2 in the same process step.

Subsequently, as shown in FIG. 5(c), the emitter layer 6 consisting of polysilicon is formed on the surface of the cap layer 5 by CVD. Here, phosphorus is in-situ doped into the emitter layer 6 in such a manner that the phosphorus concentration becomes, for example, approximately $2 \times 10^{18}$ $cm^{-3}$. This step can also be conducted both in the first and second transistor-producing regions A1 and A2 simultaneously.

After conducting the emitter layer formation step, as shown in FIG. 6(a), the emitter layer 6 is covered with a photoresist R in the first transistor-producing region A1 and the photoresist R is opened to expose the emitter layer 6 in the second transistor-producing region A2 in the photolithography step. Thereafter, phosphorus ions are implanted into the emitter layer 6 in the second transistor-producing region A2 through the opening of the photoresist R to obtain a concentration thereof of approximately $2 \times 10^{19}$ $cm^{-3}$. This ion implantation step increases the phosphorus concentration of the emitter layer 6 in the second transistor-producing region A2, and this portion becomes a high-concentration emitter layer 61 as shown in FIG. 6(b), having a higher phosphorus concentration than the emitter layer 6 in the transistor-producing region A1. It is preferable that the ratio of the phosphorus concentration of the emitter layer 6 in the second transistor-producing region A2 relative to that in the first transistor-producing region A1 be not less than 2 and not more than 1000. When this ratio is less than 2, there is a tendency for no significant difference to exist between ON-state voltages. When the ratio is more than 1000, in some cases, phosphorus transfers from the emitter layer 6 to the collector layer 2 due to the below-described heat treatment applied to the emitter layer 6, and this may cause the entire base layer 4 to contain boron and phosphorus and fail to function as a bipolar transistor.

Figure 8:
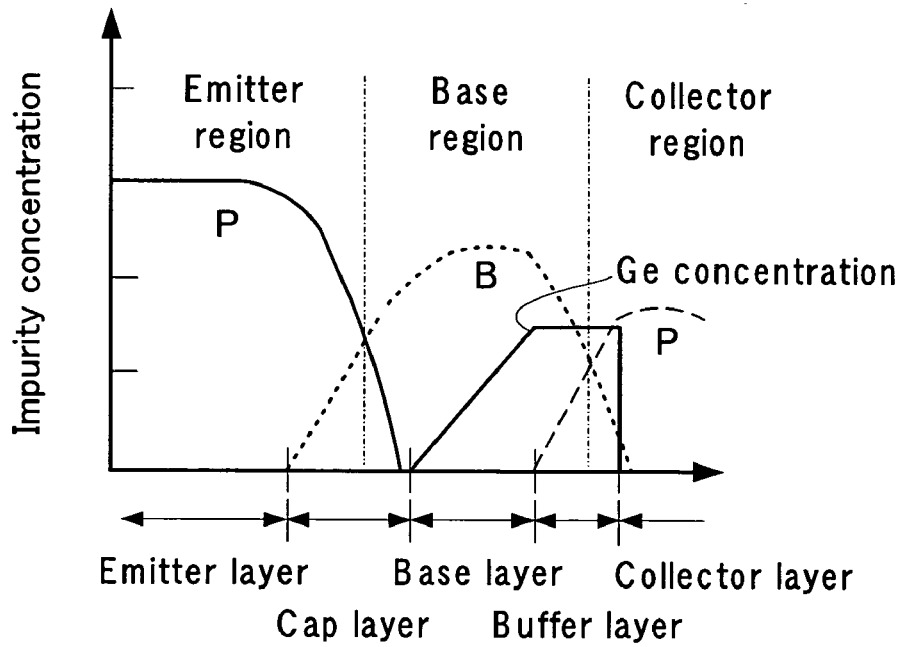
FIGS. 8(a) and (b) show the concentration distributions of impurities in the first and second transistor-producing regions, A1 and A2, according to one embodiment of the present invention.
Figure 8:
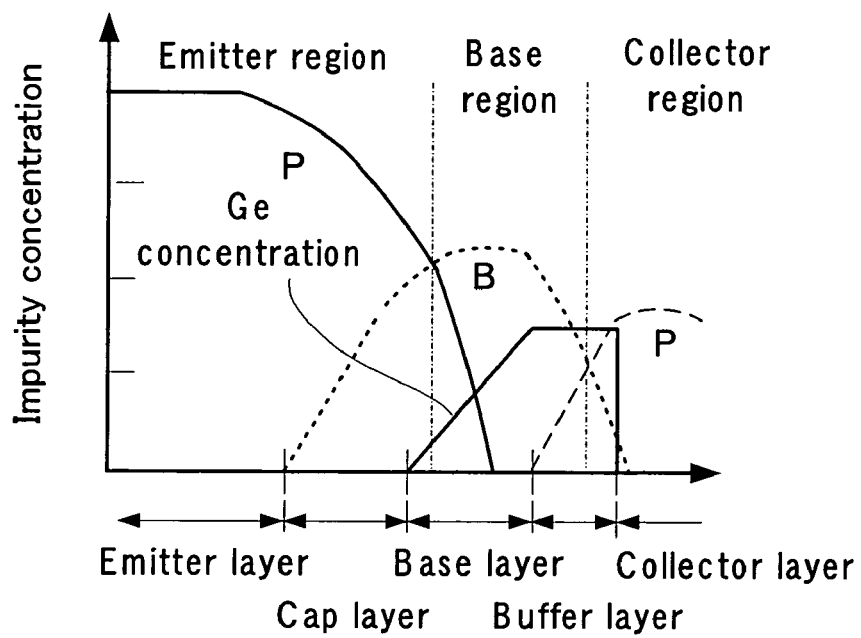

Thereafter, all of the photoresist R is removed and dopants are diffused and activated by a heat treatment conducted under conditions, for example, of approximately 800–1050° C. for 1 to 30 seconds. The higher the concentration of the phosphorus implanted into the emitter layer 6, the deeper the phosphorus is diffused. Therefore, the concentration distributions of impurities in the first and second transistor-producing regions A1 and A2 become as shown in FIGS. 8(a) and (b), respectively. In other words, the base-emitter junction interface in the second transistor-producing region A2 is located in a deeper position than that in the first transistor-producing region A1, and has a higher Ge concentration.

Subsequently, as shown in FIG. 6(c), by performing conventional etching, the emitter layer 6 and the high-concentration emitter layer 61 are processed to expose the cap layer 5 in the first and second transistor-producing regions A1 and A2, and the buffer layer 3, the base layer 4, and the cap layer 5 are then processed.

Thereafter, as shown in FIG. 7, the entire surface of the substrate is covered with an interlayer insulating film 10 and openings are formed in the interlayer insulating film 10 by lithography. Metal plugs 12 and metal wires 14 are then formed by patterning a metal film that was formed by sputtering, etc., on the surface of the interlayer insulating film 10. A bipolar transistor is thus formed in each of the first and second transistor-producing regions A1 and A2, obtaining a semiconductor integrated circuit wherein the bipolar transistor in the second transistor-producing region A2 has a lower ON-state voltage than that in the first transistor-producing region A1.

According to the method for fabricating a semiconductor integrated circuit of the present embodiment, it is possible to obtain a plurality of bipolar transistors having different phosphorus concentrations in the emitter layer 6 merely by conducting the lithography step and the ion implantation step after forming the emitter layer 6. Therefore, it is possible to readily obtain a semiconductor integrated circuit comprising bipolar transistors having various ON-state voltages to meet the needs of specific circuit characteristics, etc., in a fast manner at low cost.

The phosphorus concentration in the emitter layer 6 depends on the thickness of the emitter layer 6, etc.; however, it can be adjusted in the range of, for example, from $1 \times 10^{18}$ to $1 \times 10^{20}$ $cm^{-3}$.

In the present embodiment, the Ge concentration of the base layer 4 decreases in the direction from the collector layer 2 side to the emitter layer 6 side; however, the Ge concentration is not limited to this as long as the following conditions can be fulfilled. Note that, to simplify the following explanation, the concentration of the first conductive impurities contained in the emitter layer 6 of the first bipolar transistor formed in the first transistor-producing region A1 is set lower than the first conductive impurities contained in the emitter layer 6 of the second bipolar transistor formed in the second transistor-producing region A2.

Figure 9:
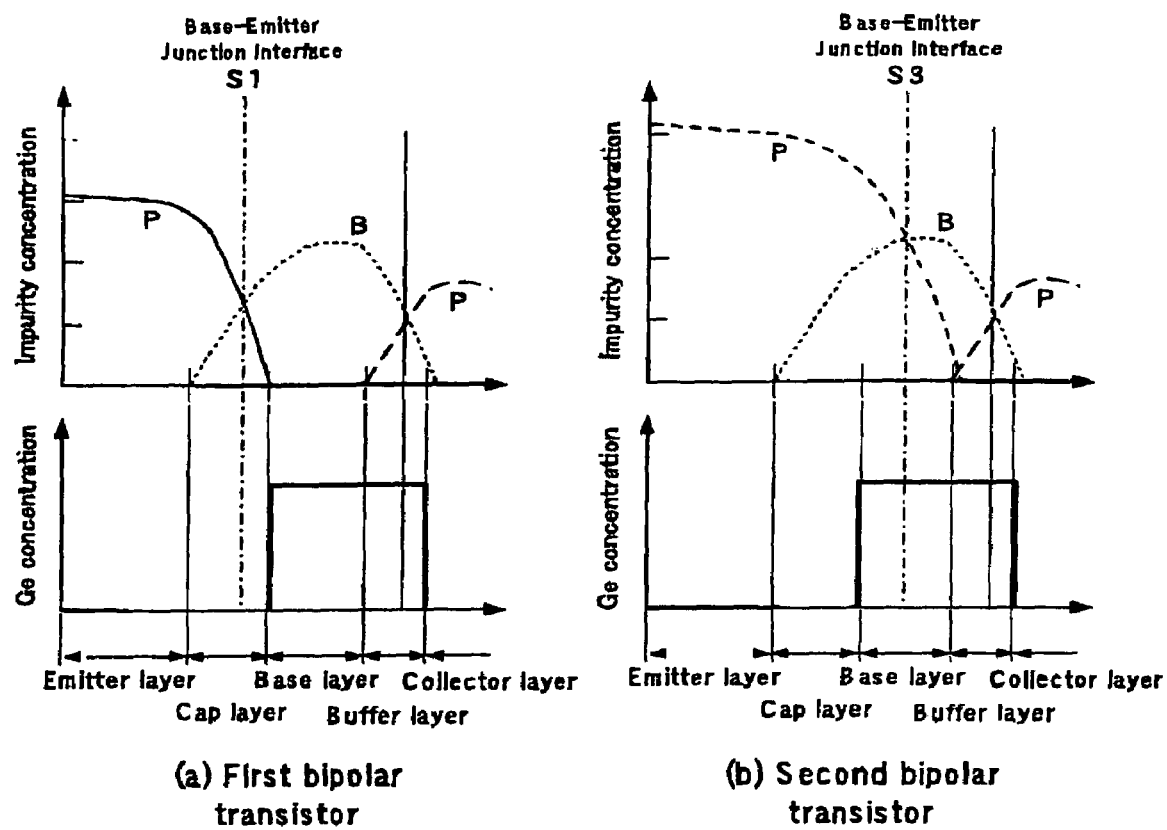
FIGS. 9(a) and (b) show the concentration of germanium contained in the base layer is invariant within the base layer in the first bipolar transistor and the second bipolar transistor according to one embodiment of the present invention.

When the base-emitter junction interface in the first bipolar transistor formed in the first transistor-producing region A1 is one such as Si shown in FIG. 2 (in other words, when the base-emitter junction interface is located in the cap layer 5, in which no Ge exists), the Ge concentration contained in the base layer 4 does not have to be varied as long as the base layer 4 contains Ge and the base-emitter junction interface in the second bipolar transistor formed in the second transistor-producing region A2 is located in the base layer 4. Therefore, in this case, the Ge concentration contained in the base layer 4 may be uniform as shown in FIGS. 9(a) and (b).

In contrast, when the base-emitter junction interface in the first bipolar transistor formed in the first transistor-producing region A1 is one such as S2 shown in FIG. 2 (in other words, when the base-emitter junction interface is included in the base layer 4), the base layer 4 must contain Ge, and the concentration of Ge contained in the base layer 4 must be varied so as to be higher along the deeper direction (the direction toward the right-hand side of FIG. 2). This is because, in this case, if the Ge concentration of the base layer 4 is uniform, the ON-state voltage of the second bipolar transistor undesirably becomes the same as that of the first bipolar transistor.

Moreover, when the concentration of Ge contained in the base layer 4 is varied along the deeper-direction, the variation of the Ge concentration does not necessarily have to be linear, and may be stepwise, curved, etc. For example, when the variation of the Ge concentration is stepwise, the base-emitter junction interface can be readily located at a position having a desired Ge concentration, making it possible to set the ON-state voltage more accurately.

SiGe is used to form the buffer layer 3 and the base layer 4 in the present embodiment; however, SiGeC, etc., can also be used.

In the present embodiment, a case wherein two bipolar transistors having different ON-state voltages are formed is explained. However, it is also possible to form three or more bipolar transistors having different ON-state voltages in the same manner as the present embodiment. For example, a semiconductor integrated circuit having three transistor-producing regions A1, A2 and A3 is fabricated in the following manner. First, the emitter layer 6 is formed. The ion implantation step is then conducted using a lithography step to leave photoresist in the regions A1 and A2 while exposing the region A3. Subsequently, the photoresist in the region A2 is removed, followed by further ion implantation with the regions A2 and A3 being exposed.

Even when many bipolar transistors are formed, it is possible to readily set the ON-state voltage of each bipolar transistor at a desired level by repeating the lithography step and the ion implantation step.

Figure 10:
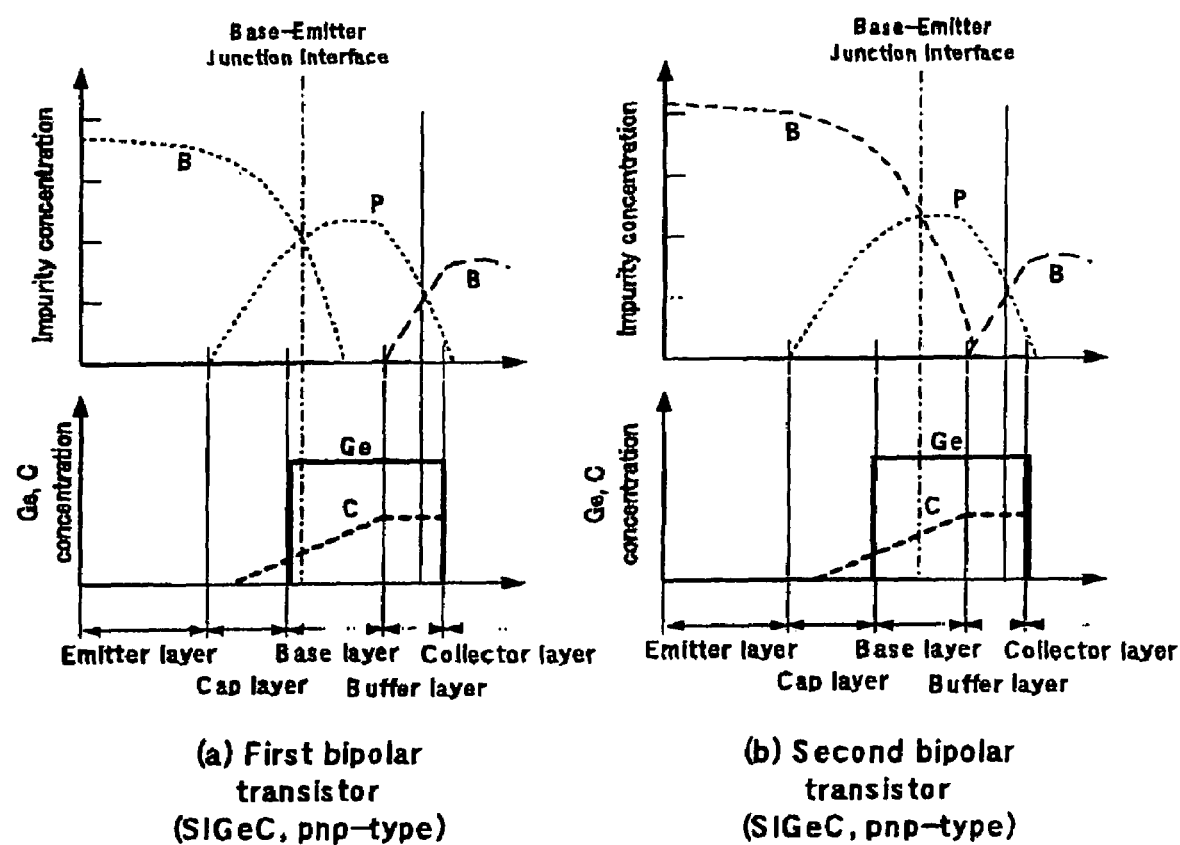
FIGS. 10(a) and (b) show that carbon concentration decreases in the direction from the collector layer side toward the emitter layer side in the First bipolar transistor and the Second bipolar transistor according to one embodiment of the present invention.

In this specification, an npn-type bipolar transistor is illustrated; however, the same effects can also be achieved with a pnp-type bipolar transistor. In this case, it is suitable to vary energy band gap in the base layer 4 required when SiGeC is used as a material for composing the base layer 4 by varying the C (carbon) concentration as shown in FIGS. 10(a) and (b). As an example of the specific method, the C concentration can be varied in the depth direction as shown in FIG. 2.

The bipolar transistor described in the present specification has a simple, so-called mesa type structure. However, the present invention can also be employed in bipolar transistors having other structures (for example, double polysilicon types, single polysilicon types, selective epitaxial types, etc.). Furthermore, in the present invention, only bipolar transistors are shown; however, it is also possible to incorporate these bipolar transistors into conventional SiGe-BiCMOS devices.

INDUSTRIAL APPLICABILITY

As described above, the present invention provides a fabrication method for a semiconductor integrated circuit and a semiconductor integrated circuit those can reduce power consumption while maintaining the excellent performance of a bipolar transistor.

The invention claimed is:

1. A semiconductor integrated circuit comprising a plurality of bipolar transistors that are obtained by forming, in each of a plurality of transistor-producing regions, a first conductive type emitter layer on the front surface side of a second conductive type base layer that is formed on the front surface side of a first conductive collector layer and wherein the second conductive type base layer contains germanium, the first conductive type emitter layer being formed from a semiconductor material having a band gap larger than the base layer;

the concentrations of first conductive type impurities contained in the emitter layer varying among the plurality of transistor-producing regions, causing the germanium concentrations to be different in base-emitter junction interfaces of at least two of the transistor-producing regions, thus making ON-state voltages, which are necessary for turning the plurality of the bipolar transistors into an ON state different from each other.

2. The semiconductor integrated circuit according to claim 1, wherein the ON-state voltage is a voltage across the base and emitter that causes a collector current to be no less than a predetermined value.

3. The semiconductor integrated circuit according to claim 1, wherein the base layer is SiGe or SiGeC.

4. The semiconductor integrated circuit according to claim 1, wherein the emitter layer is polysilicon.

5. The semiconductor integrated circuit according to claim 1, wherein, in at least two of the transistor-producing regions, the germanium concentrations are different between base-emitter junction interfaces formed by thermal diffusion of the impurities in the base layer and the emitter layer.

6. The semiconductor integrated circuit according to claim 1, wherein the base layer has an area whose germanium concentration decreases in the direction from the collector layer side toward the emitter layer side.

7. The semiconductor integrated circuit according to claim 6, wherein the germanium concentration decreases linearly in the base layer.

8. The semiconductor integrated circuit according to claim 6, wherein the germanium concentration decreases stepwise in the base layer.

9. The semiconductor integrated circuit according to claim 1, wherein the emitter layer is formed on the front surface side of a laminate having a buffer layer formed of silicon germanium, the base layer, and a cap layer formed of silicon that is layered in this order on the front surface side of the collector layer;

the germanium concentration of the base layer being set so as to decrease from the germanium concentration of the buffer layer in the direction from the collector layer side toward the emitter layer side to eventually become 0.

10. The semiconductor integrated circuit according to claim 1, wherein the germanium concentration distribution in the base layer in each transistor-producing region is substantially the same.

11. The semiconductor integrated circuit according to claim 1, wherein the height from the surface of the collector layer to the base layer is substantially the same.

12. The semiconductor integrated circuit according to claim 1, wherein the size of the bipolar transistor in each transistor-producing region is substantially the same.

13. The semiconductor integrated circuit according to claim 1, wherein the concentration of germanium contained in the base layer is invariant within the base layer.

14. The semiconductor integrated circuit according to claim 1, wherein the first conductive type is p type, the second conductive type is n type, and the base layer further contains carbons.

15. The semiconductor integrated circuit according to claim 14, wherein the base layer has an area whose carbon concentration decreases in the direction from the collector layer side toward the emitter layer side.

* * * * *

UNITED STATES PATENT AND TRADEMARK OFFICE
CERTIFICATE OF CORRECTION

| | | |
|---|---|---|
| PATENT NO. | : 7,084,484 B2 | Page 1 of 1 |
| APPLICATION NO. | : 10/910573 | |
| DATED | : August 1, 2006 | |
| INVENTOR(S) | : Akira Asai et al. | |

It is certified that error appears in the above-identified patent and that said Letters Patent is hereby corrected as shown below:

In the title page of the Letters Patent,

Please add sections:

(63) Related U.S. Application Data
   Continuation of Application No. PCT/JP2004/000172, filed on January 14, 2004

And,

(30) Foreign Application Priority Data
   Jan. 14, 2003   (JP) ……………………..2003-5686

Signed and Sealed this

Twelfth Day of June, 2007

JON W. DUDAS
*Director of the United States Patent and Trademark Office*